United States Patent
Broutin et al.

(10) Patent No.: US 6,236,667 B1
(45) Date of Patent: May 22, 2001

(54) METHOD FOR TEMPERATURE COMPENSATING AN OPTICAL FILTER

(75) Inventors: Scott L. Broutin, Maxatawny Township; James Kevin Plourde, Allentown; John William Stayt, Jr., Schnecksville, all of PA (US)

(73) Assignee: Agere Systems Inc., Miami Lakes, FL (US)

( * ) Notice: Subject to any disclaimer, the term of this patent is extended or adjusted under 35 U.S.C. 154(b) by 0 days.

(21) Appl. No.: 09/338,336

(22) Filed: Jun. 23, 1999

(51) Int. Cl.[7] .................................................. H01S 3/13
(52) U.S. Cl. ............................ 372/32; 372/34; 372/38
(58) Field of Search ............................ 372/38, 34, 32, 372/29

(56) References Cited

U.S. PATENT DOCUMENTS

| | | | |
|---|---|---|---|
| 4,243,952 | * | 1/1981 | Patterson ........................ 331/94.5 S |
| 4,375,067 | * | 2/1983 | Kitamura .......................... 372/43 X |
| 4,710,631 | * | 12/1987 | Aotsuka et al. ...................... 372/34 |
| 5,019,769 | * | 5/1991 | Levinson ............................. 372/29 |
| 5,946,334 | * | 8/1999 | Ema et al. ........................... 372/38 |
| 5,999,551 | * | 12/1999 | Yoshizawa .......................... 372/34 |
| 6,023,053 | * | 2/2000 | Nakayama et al. ............... 219/121.6 |
| 6,145,474 | * | 11/2000 | Yoshida ............................. 372/38 |

* cited by examiner

Primary Examiner—Leon Scott, Jr.

(57) ABSTRACT

A method for temperature compensating an optical filter utilizes information relating to the temperature coefficient/constant of the optical filter to identify a value for the feedback resistor in a transimpedance preamplifier contained in a laser control system. Changes or effects in transmission resulting from temperature changes in the optical filter can be compensated by selecting a feedback resistor or resistors having a temperature dependence value and corresponding sign and magnitude to offset the undesirable effects on the transmission resulting from temperature tuning of a laser and thereby varying the temperature dependencies of the optical filter in the signal path.

10 Claims, 1 Drawing Sheet

METHOD FOR TEMPERATURE COMPENSATING AN OPTICAL FILTER

BACKGROUND OF THE INVENTION

1. Field of the Invention

The present invention relates to laser tuning and, more particularly, to a method for temperature compensating an optical filter (e.g. etalon).

2. Description of the Related Art

Generally, lasers can be tuned by varying the wavelength or, equivalently, the laser frequency while minimizing other undesirable or unwanted effects. However, when tuning a currently available distributed feedback (DFB) laser, it may not be possible to vary the wavelength without causing other undesirable effects. In addition, optical frequency or wavelength stabilization of lasers is required for dense wavelength division multiplexing (DWDM) applications. Stable optical filters such for example, as etalons, are used for wavelength stabilization.

Since the laser wavelength is a function of temperature, lasers are currently tuned with temperature. Unfortunately, when tuning using temperature other parameters such as optical power also change, thus requiring an optical power control system. Generally, power control is present in the laser system, so that this requirement does not present a major problem. Thus, the wavelength control system feeds a control current or control voltage to a control terminal which changes the laser wavelength. A thermoelectric cooler (TEC) coupled to the wavelength control system receives this control signal and responds thereto by changing the temperature of the laser and thereby the wavelength.

Due to space limitations, and for cost and packaging considerations, the optical filter associated with the laser is located in a butterfly package on the same TEC as the laser, and therefore may also experience a change in temperature as a result of the temperature tuning. This change in temperature of the optical filter results in an additional limitation in performing wavelength stabilization, because optical filters have temperature characteristics that provide optimal functioning within a specified temperature range. Specifically, each optical filter inherently has a temperature coefficient or constant that indicates its optimal operating temperature. Thus, the optical filter's temperature stability is of integral concern since temperature tuning will be used in the first generation of frequency (wavelength) stabilized laser products.

SUMMARY OF THE INVENTION

In accordance with a preferred embodiment of the present invention, a method for temperature compensating an optical filter comprises the steps of determining a temperature coefficient of the optical filter, and selecting a feedback resistor in a transimpedance preamplifier having a temperature dependence value and corresponding sign and magnitude selected to offset any changes in transmission through the optical filter resulting from variations in temperature caused by temperature tuning of the laser.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
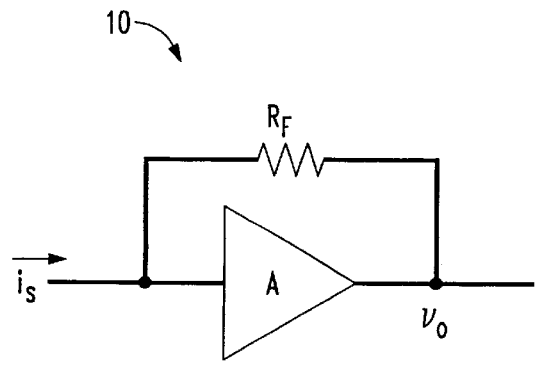
FIG. 1 is a schematic diagram of a standard transimpedance preamplifier used in a laser control system.

Referring initially to FIG. 1, there is shown a standard transimpedance preamplifier 10 used in laser control systems and formed of an operational amplifier A and a shunting feedback resistor $R_F$. The transimpedance preamplifier has been adopted as the standard way to amplify a photodiode (detector) output. The photodiode (not shown) is essentially a current source whose output current is a function of the input optical power. Thus, the transimpedance preamplifier converts the input current to a voltage. The transimpedance preamplifier 10 has a behavior characteristic corresponding to or represented by the relationship: $v_o = -i_s R_F$. The preamplifier 10 is not part of the laser, but may be part of the laser module (i.e. included in the same package that contains the laser).

Figure 2:
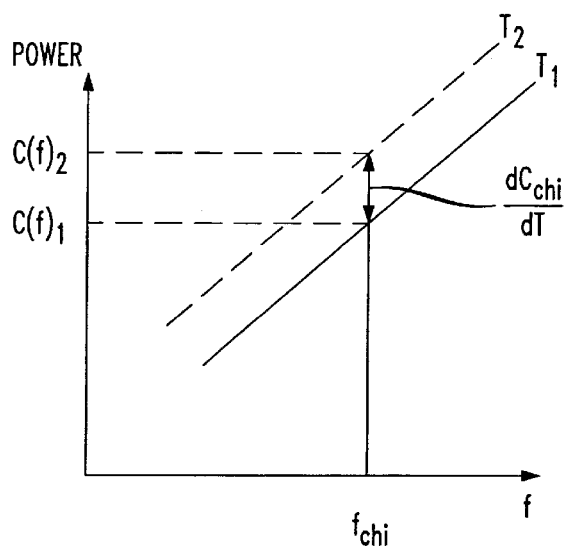
FIG. 2 is a graphical representation of optical power versus optical frequency for an optical filter.

FIG. 2 depicts a graph of optical power versus optical frequency. As shown, C(f) is the fraction of optical power that is transmitted through the optical filter at an optical frequency f, and can range from 0 to 1. The designation $f_{chi}$ identifies the optical frequency at an optical channel i. As seen in FIG. 2, the optical power $C(f)_1$ required for transmission at a different frequency $f_{chi}$ with a temperature $T_1$ is less than the optical power $C(f)_2$ required for transmission at temperature $T_2$ for the same frequency $f_{chi}$. Thus, it is clear that the operating temperature, as for example adjusted by the thermoelectric cooler (TEC) of the laser control system, directly affects the required optical power transmission through the optical filter to achieve transmission at the optical channel frequency ($f_{chi}$). It is this temperature dependence (delineated $dC_{chi}/dT$) that requires compensation.

A two-path approach to wavelength stabilization is disclosed in applicant's co-pending U.S. patent application Ser. No. 09/265,291, filed on Mar. 9, 1999, which is incorporated herein by reference. This two-path approach introduces digital data processing to the laser control system and enables more accurate control of wavelength stabilization through the modulation and demodulation of control signals fed to the thermoelectric cooler.

In practice, exact compensation may not be possible over a wide range of temperatures. For example, a total shift of 20° C. may be required to tune over 4 channels of 50 GHz spacing. If the optical filter has a typical temperature effect of 5 ppm/deg C (which is a typical dependence), then an overall shift of 100 ppm may be encountered, which is almost 10 times the stabilization goal. Thus, the ability to reduce this effect from a hardware perspective to as small as possible compared to the stability goal is very important.

Figure 3:
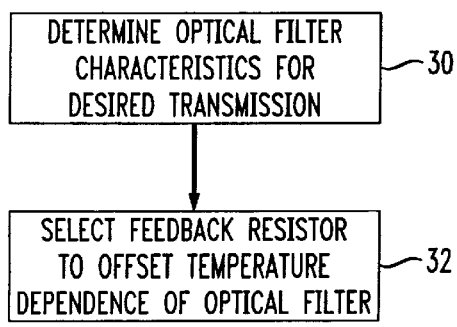
FIG. 3 is a flow chart of a method for temperature compensating an optical filter in a laser control system in accordance with the present invention.

Referring now to FIG. 3, a method for temperature compensating an optical filter in accordance with a preferred embodiment of the present invention includes the steps of determining the optical filter characteristics for a desired transmission (step 30), and then selecting a value for the feedback resistor in the transimpedance preamplifier of the signal path using the so-determined optical filter temperature characteristics (step 32). The selection of the feedback resistor must take into consideration the resistor technology being used and the temperature coefficient of the resistor technology. Once this information is determined, the magnitude of the feedback resistor is selected to offset the temperature dependence of the optical filter.

In accordance with a currently-contemplated embodiment of the inventive method, the optical filter is used as the frequency reference. The transmission through the optical filter depends upon the optical frequency and temperature characteristics of the filter. Thus, the electrically detected optical signal resulting from the transmission is a function of both the optical frequency and its own temperature characteristics. Any change in the amplitude of the electrically detected signal is therefore interpreted as a change in the optical frequency through the optical filter. The change in amplitude of transmission through the temperature dependent optical filter results in a transmission error The following mathematical analysis demonstrates the manner in which the optical filter temperature compensation can be performed through the use of the transimpedance preamplifier and the modification or selection of the feedback resistor value in accordance with the temperature coefficient/constant of the optical filter. Assuming that a positive optical slope of the optical filter corresponds to a stable operating point, $$C(f) = \left|\frac{dC}{df}\right|\Delta f + C_{chi}$$

and $$i_s = PRC(f) = PR\left\{\left|\frac{dC}{df}\right|\Delta f + C_{chi}\right\}$$

where P=optical power, R=responsivity of the optical detector, dC/df=the optical filter slope, and $\Delta f$ is the change in optical frequency from the desired $f_{chi}$. Therefore, $$v_o \cong -i_s R_F = -PR\left\{\left|\frac{dC}{df}\right|\Delta f + C_{chi}\right\}R_F$$

Ideally, $dv_0/dT=0$ is desired, where T is the temperature. However, $$\frac{dv_o}{dT} \cong -PRC_{chi}\frac{dR_F}{dT} - PR R_F\frac{dC_{chi}}{dT},$$

where it was assumed that $$\frac{d}{dT}\left\{\left|\frac{dC}{df}\right|\right\} = 0,$$

and the remaining terms are not a significant function of temperature.

Thus, in order to make $$\frac{dv_o}{dT} = 0,$$

$$C_{chi}\frac{dR_F}{dT} + R_F\frac{dC_{chi}}{dT} = 0,$$

or written differently $$\frac{R_F}{C_{chi}} = -\frac{dR_F/dT}{dC_{chi}/dT}$$

Thus, in order to temperature compensate the optical filter, the feedback resistor $R_F$ of the transimpedance preamplifier is chosen to have an opposite slope to that of the optical filter having a known temperature coefficient, and $$\left|\frac{R_F}{C_{chi}}\right| = \left|\frac{dR_F/dT}{dC_{chi}/dT}\right|$$

The magnitude of $R_F$ is chosen to achieve this condition. Generally, resistors are available in discrete values with certain slopes dependent upon the resistor technology (e.g. carbon, thin film metal, etc.). With the temperature coefficient of the optical filter and its transmission value known at the frequency locking point, this condition can be approximately achieved (i.e. $R_F$ can be calculated and selected accordingly), the frequency locking point being the particular operating point to achieve the desired optical frequency. The reason for this approximation is that, in practice, $R_F$ may not be set exactly to the calculated value, either because (i) standard resistors are only available in certain values, or (ii) a number of calculated values for a particular application may be close to each other and not exactly the same when attempting to lock at a number of optical frequencies with the same product. Thus, a number of operating points may apply, and $R_F$ is set to an approximate value to cover the desired range.

In an alternative embodiment, it may be required to change the temperature coefficient of the feedback resistor $R_F$. Often times, use of a particular resistor technology may be desired for various reasons, such as stability, and as a result, a choice of temperature coefficient of resistance may not be available. Thus, the temperature coefficient of the selected feedback resistor may be required to have an opposite sign to compensate the optical filter in the manner described previously (i.e. the opposite sign of the slope of the optical filter). This opposite sign must therefore be corrected in order for proper temperature compensation to be performed, and the correction can be performed using the reference path feedback resistance, or a combination of modifying both the signal path and reference path feedback resistances. As mentioned, the output control voltage (at the output of the transimpedance preamplifier) is given by $$v_o = -P_1 R\left\{\left|\frac{dC}{df}\right|\Delta f + C_{chi}\right\}R_{F_1}$$

Likewise, the output from the reference path is given by $$v_2 = -P_s R R_{F_2}$$

After normalization, $$\frac{v_o}{v_2} = \frac{P_1}{P_2}\left\{\left|\frac{dC}{df}\right|\Delta f + C_{chi}\right\}\frac{R_{F_1}}{R_{F_2}}$$

However, in order to temperature compensate the optical filter, we desire $$\frac{d}{dT}\left(\frac{v_o}{v_2}\right) = 0$$

Thus, $$\frac{d}{dT}\left(\frac{v_o}{v_2}\right) = C_{chi}\frac{d}{dT}\left(\frac{R_{F_1}}{R_{F_2}}\right) + \frac{dC_{chi}}{dT}\frac{R_{F_1}}{R_{F_2}} = 0,$$

where again $$\frac{d}{dT}\left\{\left|\frac{dC}{df}\right|\right\}$$

ignored. This can be rewritten as, $$\frac{1}{C_{chi}}\left(\frac{R_{F_1}}{R_{F_2}}\right) = \frac{\frac{R_{F_1}}{R_{F_2}}\frac{dR_{F_2}}{dT} - \frac{1}{R_{F_2}}\frac{dR_{F_1}}{dT}}{\frac{dC_{chi}}{dT}} = \frac{\left(\frac{R_{F_1}}{R_{F_2}}\right)\left\{\frac{1}{R_{F_2}}\frac{dR_{F_2}}{dT} - \frac{1}{R_{F_1}}\frac{dR_{F_1}}{dT}\right\}}{\frac{dC_{chi}}{dT}}$$

$R_{F1}$ and $R_{F2}$ are the feedback resistors of the transimpedance preamplifier in the signal path and reference path, respectively, of the laser control system. By selecting the resistance values with magnitudes of $R_{F1}$ and $R_{F2}$ as a function of the temperature coefficients of the optical filter and feedback resistors such that this equation is satisfied, temperature compensation can be achieved. Thus, either a positive or negative temperature coefficient is effectively achieved depending upon the relative amplitudes of the terms of the numerator in the above equation. This example demonstrates the selection of both $R_{F1}$ and $R_{F2}$ based on desired operating characteristics; however, one of ordinary skill in the art will recognize that the required compensation for a feedback resistor in the signal path $R_{F1}$ (i.e. optical filter path) having a temperature coefficient with the same sign as the slope of the optical filter can be compensated by selecting or modifying the value of the feedback resistance $R_{F2}$ in the reference path.

While there have been shown and described and pointed out fundamental novel features of the invention as applied to preferred embodiments thereof, it will be understood that various omissions and substitutions and changes in the form and details of the methods described and devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A method for temperature compensating an optical filter for wavelength stabilization in a laser transmission control system having a signal path comprising the steps of:
   identifying temperature dependent operating characteristics of the optical filter for a desired one or more transmissions; and
   selecting a feedback resistance value in a transimpedance preamplifier disposed in a wavelength control loop of the laser transmission control system to substantially compensate for the identified temperature dependent operating characteristics of the optical filter for the desired one or more transmissions.

2. The method set forth in claim 1, wherein said step of selecting feedback resistors comprises setting the value of the feedback resistance such that a slope of its signal response is opposite in sign to a signal response slope of the optical filter.

3. The method set forth in claim 1, wherein said step of selecting further comprises the steps of:
   determining a resistor technology to be used in the wavelength control loop;
   determining a temperature coefficient of the resistor technology; and
   selecting a magnitude of feedback resistance based on the determined resistor technology and the temperature coefficient.

4. The method set forth in claim 1, wherein said step of selecting further comprises the step of selecting a resistor having an opposite temperature coefficient to that of the optical filter.

5. The method set forth in claim 4, wherein said step of changing the temperature coefficient of the feedback resistance comprises changing a sign of the temperature coefficient of the selected feedback resistance.

6. The method set forth in claim 5, wherein changing of the sign of the temperature coefficient of the selected feedback resistance comprises the steps of:
   normalizing an output control voltage of a reference path with an output control voltage of the signal path; and
   selecting a value of a second feedback resistance in a transimpedance amplifier in the reference path such that the effective sign of the temperature coefficient of the selected feedback resistance in the signal path is changed.

7. A method for temperature compensating an optical filter for laser wavelength stabilization in a laser control system having a signal path and a reference path, the optical filter being disposed in the signal path, the signal path and the reference path each having a transimpedance preamplifier for converting a control current into a control voltage, and each of the transimpedance preamplifiers having a feedback resistor, the method comprising the steps of:
   identifying temperature dependent operating characteristics of the optical filter for a desired one or more transmissions;
   selecting the feedback resistor in the signal path such that a slope of its signal response is substantially opposite in sign to a signal response slope of the optical filter.

8. The method set forth in claim 7, wherein said step of selecting further comprises the steps of:
   determining a resistor technology for the feedback resistor;
   determining a temperature coefficient of the resistor technology; and
   selecting a magnitude of feedback resistor based on the determined resistor technology and the temperature coefficient.

9. The method set forth in claim 7, wherein said step of selecting further comprises the steps of:
   identifying a sign of a temperature coefficient of a desired feedback resistor; and
   changing the feedback resistor to one having an opposite sign when its original sign is opposite to a desired sign for temperature compensating the optical filter in the signal path.

10. The method set forth in claim 9, wherein said step of changing the sign further comprises the steps of
    normalizing an output control voltage of the reference path to the output control voltage of the signal path; and
    selecting a value of the feedback resistor in the reference path to effect a change in the sign of the temperature coefficient of the selected feedback resistor.

* * * * *